United States Patent
Fachmann et al.

(10) Patent No.: US 9,583,395 B2
(45) Date of Patent: Feb. 28, 2017

(54) METHOD FOR MANUFACTURING A SEMICONDUCTOR SWITCHING DEVICE WITH DIFFERENT LOCAL CELL GEOMETRY

(71) Applicant: Infineon Technologies Austria AG, Villach (AT)

(72) Inventors: Christian Fachmann, Fuernitz (AT); Enrique Vecino Vazquez, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/968,609

(22) Filed: Dec. 14, 2015

(65) Prior Publication Data
US 2016/0099180 A1   Apr. 7, 2016

Related U.S. Application Data

(62) Division of application No. 14/309,977, filed on Jun. 20, 2014, now Pat. No. 9,231,049.

(51) Int. Cl.
*H01L 21/82* (2006.01)
*H01L 21/8234* (2006.01)
(Continued)

(52) U.S. Cl.
CPC ........... *H01L 21/823475* (2013.01); *H01L 21/823481* (2013.01); *H01L 27/11803* (2013.01);
(Continued)

(58) Field of Classification Search
CPC ..... H01L 21/823475; H01L 21/823481; H01L 27/11803; H01L 29/0696;
(Continued)

(56) References Cited

U.S. PATENT DOCUMENTS 5,121,176 A *  6/1992  Quigg ............... H01L 29/42368
                                                                257/145
5,146,426 A *  9/1992  Mukherjee .......... H01L 29/7885
                                                                257/261
(Continued)

FOREIGN PATENT DOCUMENTS

DE      19808348 C1    6/1999
DE      10246960 A1    4/2004
EP      0293846 A1    12/1988

OTHER PUBLICATIONS

Sedra, Adel S. et al., "Microelectronic Circuits", Oxford University Press, 1982, pp. 356, 368-369.

*Primary Examiner* — Mohammed Shamsuzzaman
(74) *Attorney, Agent, or Firm* — Murphy, Bilak & Homiller, PLLC

(57) ABSTRACT

A method for manufacturing a semiconductor device includes providing a semiconductor substrate having an outer rim, an active area, and an edge termination region arranged between the active area and the outer rim, and forming a plurality of switchable cells in the active area. Each of the switchable cells includes a body region, a gate electrode structure, and a source region. The active area defined by the switchable cells includes at least a first switchable region having a specific gate-drain capacitance which is different to a specific gate-drain capacitance of a second switchable region. The method further includes forming a source metallization in ohmic contact with the source regions of the switchable cells, and forming a gate metallization in ohmic contact with the gate electrode structures of the switchable cells.

3 Claims, 8 Drawing Sheets

(51) Int. Cl.
*H01L 29/78* (2006.01)
*H01L 29/66* (2006.01)
*H01L 29/423* (2006.01)
*H01L 27/118* (2006.01)
*H01L 29/417* (2006.01)
*H01L 29/06* (2006.01)

(52) U.S. Cl.
CPC .... *H01L 29/4238* (2013.01); *H01L 29/66484* (2013.01); *H01L 29/7811* (2013.01); *H01L 29/7831* (2013.01); *H01L 29/0696* (2013.01); *H01L 29/41766* (2013.01)

(58) Field of Classification Search
CPC ........... H01L 29/41766; H01L 29/4238; H01L 29/66484; H01L 29/7811; H01L 29/7831
USPC ................ 257/132, 618, 263, 139–140, 330, 257/295–296, 340, 77, 691; 326/63; 345/89, 690; 438/129
See application file for complete search history.

(56) References Cited

U.S. PATENT DOCUMENTS

| | | | |
|---|---|---|---|
| 5,451,807 A * | 9/1995 | Fujita | H01L 29/1045 257/344 |
| 5,454,807 A | 10/1995 | Lennox et al. | |
| 6,097,214 A * | 8/2000 | Troussel | G09G 3/26 326/63 |
| 6,271,562 B1 | 8/2001 | Deboy et al. | |
| 6,653,691 B2 * | 11/2003 | Baliga | H01L 23/552 257/328 |
| 6,872,990 B1 * | 3/2005 | Kang | H01L 27/0207 257/202 |
| 6,882,005 B2 * | 4/2005 | Disney | H01L 29/402 257/300 |
| 6,924,532 B2 | 8/2005 | Pfirsch et al. | |
| 7,939,882 B2 * | 5/2011 | Su | H01L 21/8234 257/328 |
| 8,680,610 B2 * | 3/2014 | Hsieh | H01L 27/088 257/302 |
| 2001/0054760 A1 * | 12/2001 | Ito | H01L 23/50 257/691 |
| 2002/0056872 A1 * | 5/2002 | Baliga | H01L 23/552 257/330 |
| 2002/0093033 A1 | 7/2002 | Zommer et al. | |
| 2002/0168821 A1 | 11/2002 | Williams et al. | |
| 2004/0113179 A1 | 6/2004 | Pfirsch et al. | |
| 2004/0232484 A1 | 11/2004 | Zommer et al. | |
| 2004/0246219 A1 * | 12/2004 | Moon | G09G 3/3648 345/89 |
| 2006/0157779 A1 | 7/2006 | Kachi et al. | |
| 2007/0126038 A1 | 6/2007 | Kobayashi | |
| 2008/0265289 A1 | 10/2008 | Bhalla et al. | |
| 2009/0090967 A1 | 4/2009 | Chen et al. | |
| 2009/0213148 A1 * | 8/2009 | Takasugi | G09G 3/3233 345/690 |
| 2010/0025748 A1 * | 2/2010 | Mauder | H01L 21/26513 257/296 |
| 2011/0163373 A1 | 7/2011 | Arzumanyan et al. | |
| 2013/0009256 A1 | 1/2013 | Okumura et al. | |
| 2013/0020635 A1 | 1/2013 | Yilmaz et al. | |
| 2013/0207101 A1 * | 8/2013 | Yamazaki | H01L 29/41733 257/43 |
| 2013/0240955 A1 * | 9/2013 | Hirler | H01L 23/481 257/263 |
| 2013/0320487 A1 * | 12/2013 | Mauder | H01L 29/861 257/509 |
| 2013/0334597 A1 | 12/2013 | Yamashita et al. | |
| 2013/0341673 A1 * | 12/2013 | Pfirsch | H01L 29/404 257/139 |
| 2013/0341674 A1 * | 12/2013 | Werber | H01L 29/32 257/140 |
| 2014/0015592 A1 * | 1/2014 | Weis | H03K 17/102 327/430 |
| 2014/0197477 A1 | 7/2014 | Onishi | |
| 2014/0374882 A1 * | 12/2014 | Siemieniec | H01L 21/324 257/618 |
| 2015/0001549 A1 * | 1/2015 | Miura | H01L 29/0603 257/76 |
| 2015/0115286 A1 * | 4/2015 | Takeuchi | H01L 21/8213 257/77 |
| 2015/0162407 A1 * | 6/2015 | Laven | H01L 29/1095 257/139 |

* cited by examiner

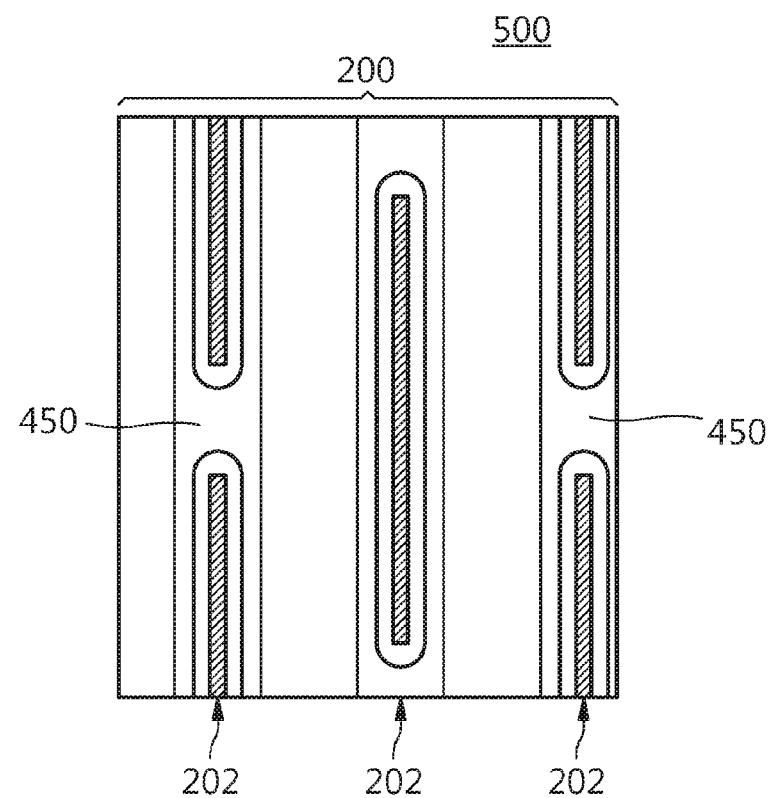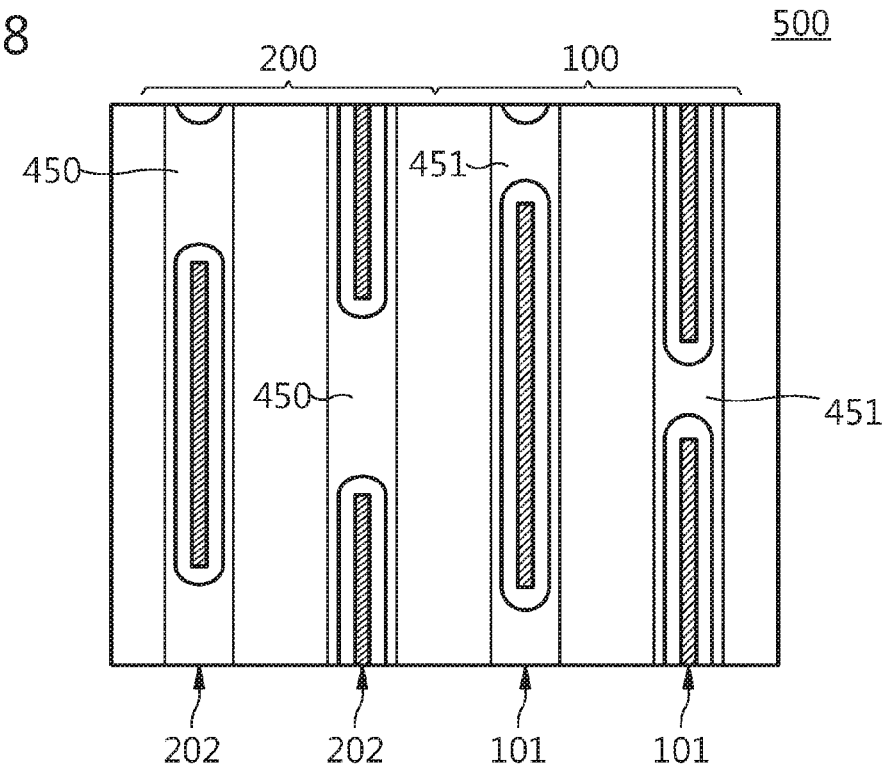

METHOD FOR MANUFACTURING A SEMICONDUCTOR SWITCHING DEVICE WITH DIFFERENT LOCAL CELL GEOMETRY

TECHNICAL FIELD

Embodiments described herein relate to semiconductor devices and in particular to semiconductor switching devices such as semiconductor power switches having different local cell geometry, and particularly a locally different gate-drain capacitance. Furthermore, embodiments described herein relate to a cell layout of switchable cells located in an active area of the semiconductor device.

BACKGROUND

Semiconductor switching devices having large chip area are provided with gate signal emitters or gate runner structures such as gate pads, gate rings, or gate fingers for transferring an external switching signal provided by external circuitry to an ensemble of switchable cells arranged in an active area of the semiconductor switching device.

Cells located at or in the proximity of an outer rim of the chip area where the gate metallization such as the gate runner structure is located can receive an external switching signal at a time before the external switching signal can reach switchable cells located in an inner region of the chip area. In particular, if a transient switching signal for a short duration occurs, only those cells close to gate signal emitters are addressed, and thus switched. The cells close to the gate signal emitters must therefore carry the full load current which can result in a current per cell higher than the rated current. Furthermore, this kind of inhomogeneous distribution of the external switching signal across the chip area can prevent the switchable cells from switching concurrently. Simultaneous operation of the switchable cells is thus not ensured and inhomogeneous switching can occur.

In view of the above, there is a need for improvement.

SUMMARY

According to an embodiment, a semiconductor device includes a semiconductor substrate having an outer rim, a plurality of switchable cells defining an active area, and an edge termination region arranged between the switchable cells defining the active area and the outer rim. Each of the switchable cells includes a body region, agate electrode structure and a source region. A source metallization is in ohmic contact with the source regions of the switchable cells. A gate metallization is in ohmic contact with the gate electrode structures of the switchable cells. The active area defined by the switchable cells includes at least a first switchable region having a specific gate-drain capacitance which is different to a specific gate-drain capacitance of a second switchable region.

According to an embodiment, a semiconductor device includes a semiconductor substrate having an outer rim, a plurality of switchable cells defining an active area, and an edge termination region arranged between the switchable cells defining the active area and the outer rim. Each of the switchable cells includes a body region, a gate electrode structure and a source region. A source metallization is in ohmic contact with the source regions of the switchable cells. A gate metallization is in ohmic contact with the gate electrode structures of the switchable cells. The active area defined by the switchable cells includes at least a first switchable region and at least a second switchable region different to the first switchable region, wherein each switchable cell in the first switchable region and the second switchable region has a specific coverage ratio, wherein the specific coverage ratio of the switchable cells in the first switchable region is different to the specific coverage ratio of the switchable cells in the second switchable region.

According to an embodiment, a method for manufacturing a semiconductor device includes: providing a semiconductor substrate having an outer rim, an active area, and an edge termination region arranged between the active area and the outer rim; forming a plurality of switchable cells in the active area, wherein each of the switchable cells includes a body region, a gate electrode structure, and a source region, wherein the active area defined by the switchable cells includes at least a first switchable region having a specific gate-drain capacitance which is different to a specific gate-drain capacitance of a second switchable region; forming a source metallization in ohmic contact with the source regions of the switchable cells; and forming a gate metallization in ohmic contact with the gate electrode structures of the switchable cells.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts.

FIG. 7 illustrates details of a layout of a switchable cell in the transition region, according to yet another embodiment.

FIG. 8 illustrates different layout of switchable cells in the first and second switchable region according to yet another embodiment.

DETAILED DESCRIPTION

Figure 1:
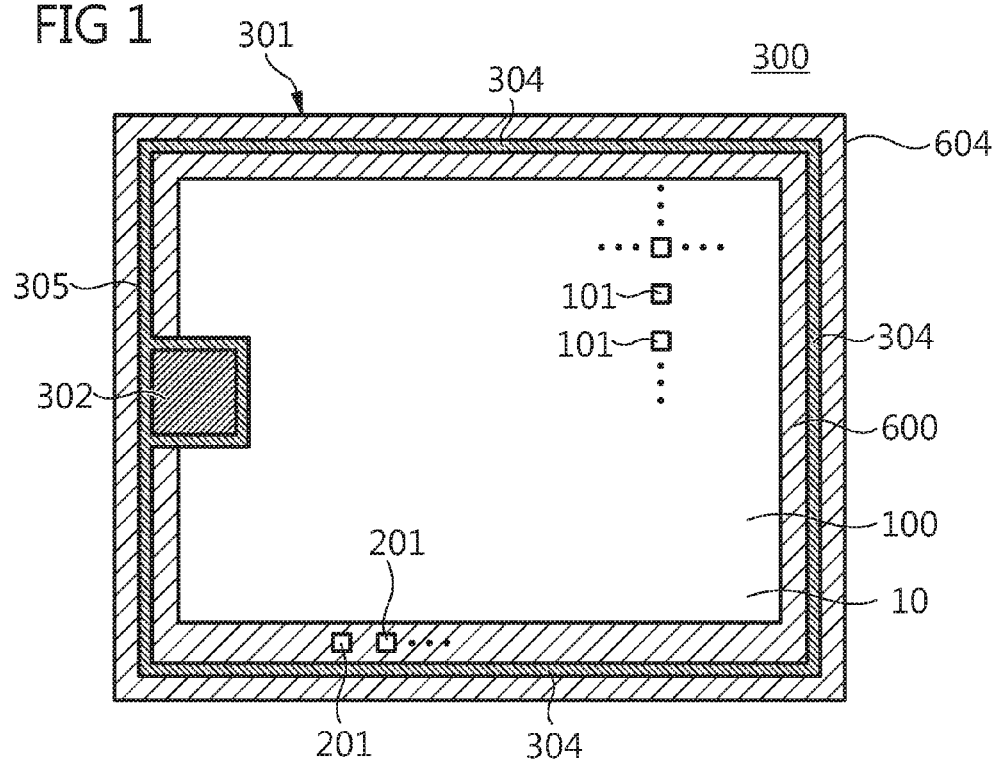
FIG. 1 illustrates a semiconductor switching device having a main switchable region which is surrounded by an edge termination region, according to an embodiment.

In the following Detailed Description, reference is made to the accompanying drawings, which form a part hereof, and in which are shown by way of illustration specific embodiments in which the invention can be practiced. In this regard, directional terminology, such as "top," "bottom," "front," "back," leading," "trailing," "lateral," "vertical," etc., is used with reference to the orientation of the Figure(s) being described. Because components of embodiments can be positioned in a number of different orientations, the directional terminology is used for purpose of illustration and is in no way limiting. It is to be understood that other embodiments can be utilised and structural or logical changes can be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to also include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include electrically conductive materials such as, but not restricted to, metal, alloys, doped polycrystalline semiconductors and metal semiconductor compounds such as metal silicides.

Field-effect controlled switching devices such as Metal Oxide Semiconductor Field-effect Transistors (MOSFETs) or Insulated Gate Bipolar Transistors (IGBTs) have been used for various applications, including use as switches in power supplies and power converters, electric cars, air-conditioners, and even stereo systems. Particularly with regard to power devices capable of switching large currents and/or operating at higher voltages, a low resistance in the conducting on-state is often desired. This means e.g. that, for a given current to be switched, the voltage drop across the switched-on FET, e.g., the source-drain voltage is desired to be low. On the other hand, the losses occurring during switching off or commutating of the FET are often also to be kept small to minimize the overall losses.

The term "semiconductor power switch" as used in this specification describes a semiconductor device on a single chip with high voltage and/or high current switching capabilities. In other words, power semiconductor devices are intended for high current, typically in the Ampere range. Within this specification the terms "semiconductor power switch," "semiconductor switching device," and "power semiconductor device" are used synonymously.

In the context of the present specification, the term "active cell region" or "active area" describes a region of a semiconductor substrate of the semiconductor switching device where switchable cells which carry the load current are arranged. The switchable cells in the active area define the switching behavior of the semiconductor switching device. Specifically, an active area can include at least a main or first switchable region and a second switchable region, optionally more than two different switchable regions. Switchable cells in different switchable regions can differ from each other in at least one physical property such as the gate-drain capacitance or the threshold voltage. The cells can also have a different cell layout in different switchable regions of the active area. The different switchable regions of the active area are also referred to as "sub-regions" of the active area and describe regions having switchable cells, or portions of switchable cells, with physical properties which are different to the physical properties of switchable cells of other sub-regions. In particular, different sub-regions can be manufactured with different gate polysilicon coverage such that the local gate-drain capacitance Cgd, e.g. a capacitance of an individual cell or a group of individual cells, varies.

In the context of the present specification, the term "cell pitch" or "longitudinal pitch" describes the pitch of the switchable cells in the active area along the longitudinal extension of the switchable cells.

In the context of the present specification, the term "gate electrode structure" describes a conductive structure which is arranged next to, and insulated from the semiconductor substrate by a dielectric region or dielectric layer. The gate electrode structure covers, when seen onto the surface of the semiconductor substrate, different regions of the semiconductor device such as body regions and drift regions. The gate electrode structure includes the gate electrodes of the switchable cells next to the body regions and also electrical connections between adjacent gate electrodes which are electrically connected with each other. The gate electrodes are configured to form and/or control the conductivity of a channel region in the body region, for example by the electric-field-mediated formation of an "inversion channel" in the body regions between the respective source regions and drift regions of the switchable cells. When forming an inversion channel, the conductivity type of the channel region is typically changed, i.e., inverted, to form an unipolar current path between the source and the drain region. The gate electrode structure is often conveniently referred to as gate polysilicon.

Examples of dielectric materials for forming a dielectric region or dielectric layer between the gate electrode and the body region include, without being limited thereto, silicon oxide ($SiO_2$), silicon nitride ($Si_3N_4$), silicon oxinitride ($SiO_xN_y$), zirconium oxide ($ZrO_2$), tantalum oxide ($Ta_2O_5$), titanium oxide ($TiO_2$) and hafnium oxide ($HfO_2$), and combinations thereof including stacks of different insulating materials.

The terms "electrical connection" and "electrically connected" describes an ohmic connection between two elements.

In the context of the present specification, the term "gate signal emitter" describes an electrode configuration which provides transfer of external switching signals to the gate electrode structure of the switchable cells. Within this specification the terms "gate metallization" and "gate signal emitter" are used synonymously. Typically, the gate metallization is formed on the gate electrode structure to improve distribution of the switching signal. For example, the gate electrode structure is formed by polysilicon and can have a net-like structure covering the active area while the gate metallization is formed on and in ohmic contact with the gate electrode structure in the periphery of the semiconductor device, for example, in the edge termination area. The gate metallization can include, for example, a gate ring, or a gate ring and gate fingers extending from the gate ring into the active area. The net-like structure of the gate electrode structure includes openings for source contacts. Gate signal emitters typically have a lower specific resistance than the gate electrode structure. For example, gate signal emitters can be made of more conductive material than the gate electrode structure and/or can be made thicker than the gate electrode structure to reduce the resistance.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

In the context of the present specification, the term "gate-drain capacitance"\ describes a capacitance formed between the gate electrode structure and the drain region of an individual switchable cell. Specifically, the gate-drain capacitance Cgd can be dependent on the specific coverage ratio of the gate electrode structure in the active area. If designed with different geometry, switchable cells located at an outer chip area of the active area can have a larger gate-drain capacitance as compared to the gate-drain capacitance of switchable cells located in a more central area of the active area. The gate-drain capacitance of a switchable cell can be influenced by the gate connected polysilicon coverage at a position of the cell.

In the context of the present specification, the term "specific coverage ratio" describes a specific ratio between an area covered by a gate electrode structure in a given region (unit area) and the total area of the given region (unit area). The unit area can be, for example, the area of a single switchable cell. In this case, the specific coverage ratio is defined by the ratio of the area of the gate electrode structure of said cell to the total area of said switchable cell. The specific coverage ratio influences the gate-drain capacitance. Typically, the higher the specific coverage ratio, the higher the gate-drain capacitance for the given region. The given region, however, does not need to correspond to a single switchable cell. The coverage of the gate electrode structure is often referred to as gate polysilicon coverage.

In particular, the specific coverage ratio can be different for switchable cells located in regions of the active area which are located closer to a gate metallization of the semiconductor device as compared to switchable cells located in regions of the active area which are located further away from the gate metallization.

When describing switchable cells to be closer to the gate metallization, this can refer either to a geometrical distance of the respective switchable cell to the gate metallization, or to the electrical value of the gate resistance that this switchable cell has. For example, the closer the switchable cell is arranged to the gate metallization, the lower is its gate resistance. As the resistance of the gate structure also varies depending on the layout of the switchable cells arranged between the gate metallization and a particular switchable cell, the gate resistance of two specific switchable cells can be different even when both have the same geometrical distance to the gate metallization. Therefore, "closer to the gate metallization" describes, when using the picture of electrical resistance, that a particular switchable cell has a lower gate resistance than another particular switchable cell.

With reference to FIG. 1, a first embodiment of a semiconductor switching device 300 having a plurality of switchable cells 101 provided in a semiconductor substrate 301 is described. The semiconductor switching device 300 has an active area 10 with a main or first switchable region 100 which is surrounded by an edge termination region 600.

The semiconductor substrate 301 includes an outer rim 604, the active area 10, and the edge termination region 600 arranged between the active area 10 and the outer rim 604. The switchable cells 101 are arranged within and define the active area 10. Each of the switchable cells 101 can include a gate electrode structure and a source region. Furthermore, a source metallization is provided which is in ohmic contact with the source regions of the switchable cells 101 through respective source contacts or plugs which extends through openings in the gate electrode structure. Furthermore, each switchable cell 101 includes a body region in which an inversion channel can be formed and/or controlled by the voltage applied to the gate electrodes.

In the edge termination region 600, inactive cells 201 are located. The inactive cells 201 are not switchable or are not capable of carrying a load current. Although the inactive cells 201 do not contribute to the load current, they are formed for process reasons and to facilitate the voltage relief in the edge termination area 600.

In situations with high d(Vds)/dt, with Vds being the drain-source voltage, or in case of commutation of the body diode there is a large (hole-) current contribution from the edge termination region 600. The cells close to the edge termination region 600 collect this current. If the large hole-current is flowing along an n-doped source region, it can trigger the emission of electrons from the n-region into the p-doped body-region. Such an emission would lead to extreme high currents and to destruction of the device. In order to prevent this, the cells at the outer boundary of the active area 10 are often designed without n-doped source-regions so that they cannot contribute to the load current. Hence, these cells 201 are "inactive".

A gate metallization 305 is formed in this embodiment in regions outside the active area 10 and includes a gate ring or gate runner 304 and a gate pad 302. According to a further embodiment, the gate pad 302 is arranged at least partially or completely in the active area 10. The gate runner 304 typically runs outside of the active area 10 and can partially extend into the active area 10 to form a good ohmic contact with the gate pad 302. According to another embodiment, the gate metallization 305 only includes a gate pad 302 which can be arranged either in the active area 10, outside of the active area 10, for example at least partially in the edge termination area, or can extend from the edge termination area 600 to the active area 10.

Semiconductor switching devices can include, but are not restricted to, MOS (metal-oxide-semiconductor) transistors such as MIS (metal-insulator-semiconductor) devices. Accordingly, a MOSFET (metal-oxide-semiconductor field-effect transistor) can include a gate insulator, e.g. an oxide. The gate metallization 305 can include a gate runner structure or gate ring, a gate pad, a gate finger, or any combinations thereof. The gate electrode structure can include highly doped polysilicon. The gate metallization 305 can include at least one of a metal, a metal alloy, and a metal layer stack. According to yet a further modification, the gate metallization 305 can have a higher specific conductivity than the gate electrode structure.

A semiconductor switching device provided on a single chip can have high voltage and/or high current switching capabilities, resulting from the layout of the individual switchable cells 101 and the combination of the switching processes of an ensemble of switchable cells 101 formed in the semiconductor chip. Thereby, such semiconductor power switches can be used in many applications if the switching behavior of the individual switchable cells can be controlled efficiently.

Inhomogeneous switching can particularly occur for short-duration or short switching processes where predominantly those switchable cells close to gate signal emitters, e.g. close to gate metallization structures are switched. For example, a parasitic current at a gate of a switchable cell resulting from a fast change of a drain-source voltage can generate a short-duration voltage increase at the gate. A gate-source voltage Vgs can amount to a value given by the following equation (1).

$$Vgs = Rg * Cgd * dV/dt, \quad (1)$$

wherein Rg is the gate resistance, Cgd is the local gate-drain capacitance, and dV/dt is the voltage change rate. As described above, the gate electrode structure not only forms the actual gate electrodes but also the electrical connection to the gate metallization to distribute the gate signal. Since the gate electrode structure has a given specific resistance ($\Omega/mm^2$), the resistance Rg, which is mainly defined by the gate electrode structure, is higher for switchable cells 101 which are more remote from the gate metallization 305 than for switchable cells 101 which are arranged closer to the gate metallization 305 due to the larger distance from the gate metallization 305. Under certain circumstances, e.g., in an avalanche mode, the different gate resistance Rg renders switchable cells 101 conductive at different points in time so that during this transition time the entire current through the semiconductor device is carried by few switchable cells 101 which were already rendered conductive. This can result in a local overstress of these switchable cells 101. Typically, switchable cells 101 in regions near the gate metallization 305 or edge termination region 600 are rendered conductive first and must therefore carry approximately the entire switching current whereas switchable cells 101 in a more central switchable region of the active area 10 are not or not completely switched, or switched at a later time. This non-uniform behavior is sometimes referred to as current splitting or formation of current filaments. Formation of current filaments stresses the involved switchable cells and can render the device inoperable.

According to embodiments which can be combined with other embodiments described herein, physical properties of the switchable cells located near the edge termination region 600 and the gate signal emitters 305 can differ from physical properties of the switchable cells 101 located more centrally in the active area 10. Such modification is used to at least partially compensate for the inhomogeneous gate signal penetration. Typically, the switching of switchable cells 101 which are arranged closer to the gate signal emitters 305 are retarded so that the gate signal can penetrate deeper into the active area 10 before the switchable cells 101 close to the gate signal emitter 305 become conductive. This increases the number of switchable cells 101 which are turned on (become conductive) during the short period of time defined by a short period switching signal. Local overstress in the region of the switchable cells 101 rendered conductive can be avoided or at least reduced.

According to an embodiment, the locally varying physical property is the gate-drain capacitance. The gate electrode structure of switchable cells 101 which are arranged closer to the gate metallization 305 can have a cell layout which is different to the cell layout of the gate electrode structure of switchable cells 101 which are arranged further away from the gate metallization 305. For example, the specific coverage ratio of switchable cells 101 which are arranged closer to the gate metallization 305 can be larger than the specific coverage ratio of switchable cells 101 which are arranged further away from the gate metallization 305. Typically, by changing the cell layout such as the cell size or pitch, the specific coverage ratio can be adapted.

According to embodiments which can be combined with other embodiments described herein, the active region 10 of switchable cells 101 can be divided in different sub-regions or different switchable regions with different specific coverage ratio such that the local gate-drain capacitance Cgd, e.g. the capacitance of an individual cell or a group of individual cells, is adjusted. It is noted here that an overall gate-drain capacitance Cgd_total of the entire semiconductor switching device 300 can be represented as a weighted sum of all individual gate-drain capacitances Cgd of involved switchable cells. Thereby, tailoring of the overall gate-drain capacitance Cgd_total can be adjusted, for example, by adapting the size of the area which is covered by the gate structures of an individual switchable cell, as this influences the local gate-drain capacitance Cgd of this specific switchable cell. Alternatively or in addition, the cell layout such as the longitudinal pitch can be varied.

According to an embodiment which can be combined with other embodiments described herein, the structure of the active area 10 or active switchable region can be designed such that the gate-drain capacitances Cgd of switchable cells 101 continuously decrease from a sub-region of the active area 10 close to the gate metallization 101 to a center region of the active area 10 further away from the gate metallization 305. According to another embodiment which can be combined with other embodiments described herein, the active area 10 can be designed such that the gate-drain capacitances Cgd of switchable cells 101 decrease step-wise from a sub-region of the active area 10 close to the gate metallization 305 to a center region of the active area 10 further away from the gate metallization 305.

The gate metallization 305 for transferring switching signals from a gate driver circuitry to the switchable cells 101 can be formed in the edge termination region 600. The gate metallization 305 is in ohmic contact with the gate electrode structures of the switchable cells 101. The gate metallization 305 can include a gate ring 304 provided in the outer region of the semiconductor substrate 301, and a gate pad 302. Gate rings 304 are used particularly for large area semiconductor devices having a plurality of switchable cells 101 to connect electrically the gate electrode structures of all switchable cells 101 with a common gate pad structure.

Switchable cells 101 located closer to the gate metallization 305, e.g. switchable cells 101 located near the edge termination region 600, can have a gate-drain capacitance Cgd larger than a gate-drain capacitance Cgd of switchable cells 101 located further away from the gate metallization 305, e.g. switchable cells 101 located in the main or first switchable region 100, for example by locally adapting the specific coverage ratio. For example, the cell layout can be different in different regions, for example in a first switchable region and a second switchable region, of the active area 10. This results in a different specific coverage ratio for the switchable cells 101 in these regions. Typically, the specific coverage ratio of switchable cells 101 in a switchable region which is disposed closer to the gate metallization 305 is larger than the specific coverage ratio of switchable cells 101 in a switchable region which is arranged further away from the gate metallization 305.

According to an embodiment, the gate electrode structure can include highly doped polysilicon. Moreover, the gate metallization 305 can include at least one of a metal, a metal alloy, and a metal layer stack. According to yet a further modification, the gate metallization 305 can have a higher specific conductivity than the gate electrode structure.

Switchable cells 101 located near the gate metallization 305 can be provided with large gate polysilicon coverage. In these switchable cells 101, due to a larger overlap area between the gate-polysilicon (gate electrode structure) and a drain or drift area, the local gate-drain capacitance Cgd is increased near the gate metallization 305 or the edge termination region 600. Alternatively or in addition to that, switchable cells 101 located more centrally can be provided with a smaller gate polysilicon coverage in order to provide lower gate-drain capacitance Cgd. The higher gate-drain capacitance Cgd of the switchable cells 101 located near the edge termination region 600 results in a local slow-down of these switchable cells 101, whereas faster switching can be provided in the more central part of the active area 10 where switchable cells 101 with a reduced gate-drain capacitance Cgd are arranged. This at least partially compensates the inhomogeneous gate signal distribution and provides for a more even switching of the device.

Figure 2:
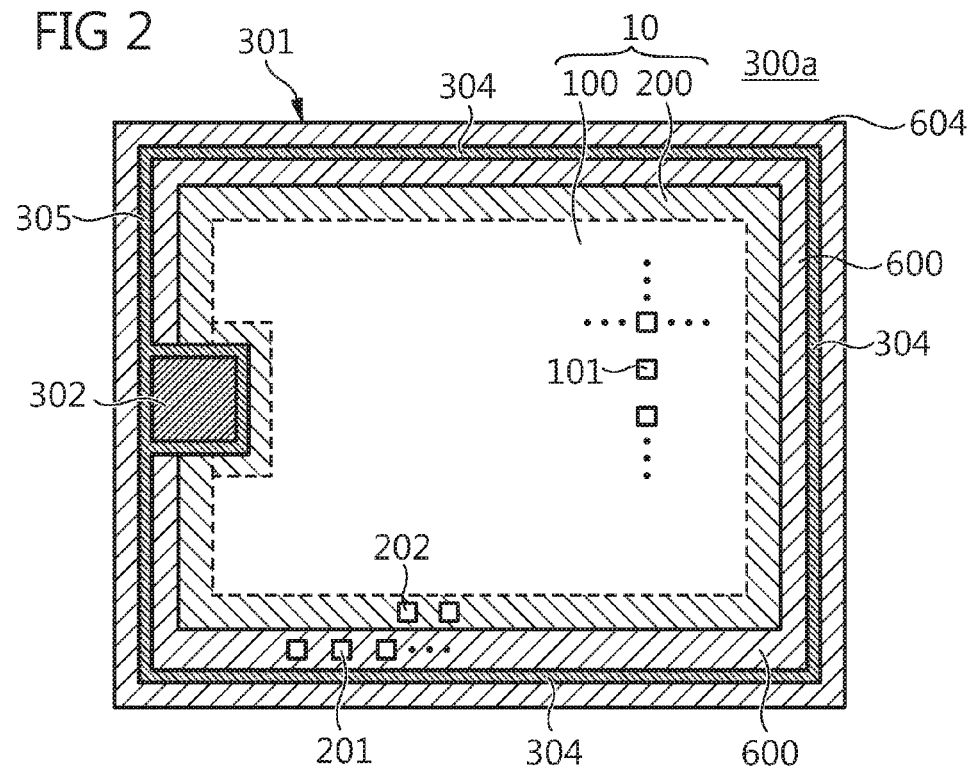
FIG. 2 illustrates a semiconductor switching device having a first switchable region and a second switchable region arranged between the first switchable region and the edge termination region, according to an embodiment.

FIG. 2 illustrates a semiconductor switching device 300a having a first switchable region 100 and a second switchable region 200 arranged between the first switchable region 100 and the edge termination region 600, according to another embodiment. The first switchable region 100 includes a plurality of first switchable cells 101, and the second switchable region 200 includes a plurality of second switchable cells 202. The second switchable region 200 can at least partially surround the first switchable region 100 as illustrated in FIG. 2.

As shown in FIG. 2, the second switchable region 200 is arranged near or adjacent to the edge termination region 600. The second switchable cells 202 are provided with a higher gate-drain capacitance than the first switchable cells 101 in the first switchable region 100. Although the second switchable cells 202 receive a switching signal before it is fully distributed to the first switchable cells 101, the increased gate-drain capacitance of the second switchable cells 202 retards the switching of the second switchable cells 202 relative to the first switchable cells 101 so that both the first and the second switchable cells 101, 202 switch approximately at the same time.

The first switchable region 100 can have a first specific coverage ratio which is different to a second specific coverage ratio of the second switchable region 200. For example, the second specific coverage ratio can be larger than the first specific coverage ratio.

A switchable cell 101, 202 has a given layout and can be defined by a single continuous source region when viewed onto the semiconductor substrate. The size of the switchable cells 101, 202 can vary in the active area 10. According to an embodiment, the active area 10 can include switchable cells 101, 202 of different size and/or layout. An example is the so-called strip layout where the source regions have the shape of long strips. As the strips can be comparably long and can even extend from a first side of the edge termination area 600 to a second side of the edge termination area 600 opposite the first side when viewed onto the semiconductor substrate, a single switchable cell 101, 202 can extend from the first switchable region 100 to the second switchable region 200. In this case, one portion of the switchable cell forms part of the first switchable region 100 while another portion of the switchable cell forms part of the second switchable region 200. Such a switchable cell 101 will than have portions with different threshold voltages. Hence, the boundary between the first and second switchable regions 100, 200 do not need to correlate to the location and boundary of individual switchable cells 101, 202.

In further embodiments, an individual switchable cell completely forms part either of the first switchable region 100 or of the second switchable region 200, or even a third switchable region if three different switchable regions are formed. In this case, each switchable cell has a given specific gate-drain capacitance and all switchable cells of a given switchable region has the same specific gate-drain capacitance with the specific gate-drain capacitance of the switchable cells of different switchable regions being different from each other.

Figure 3:
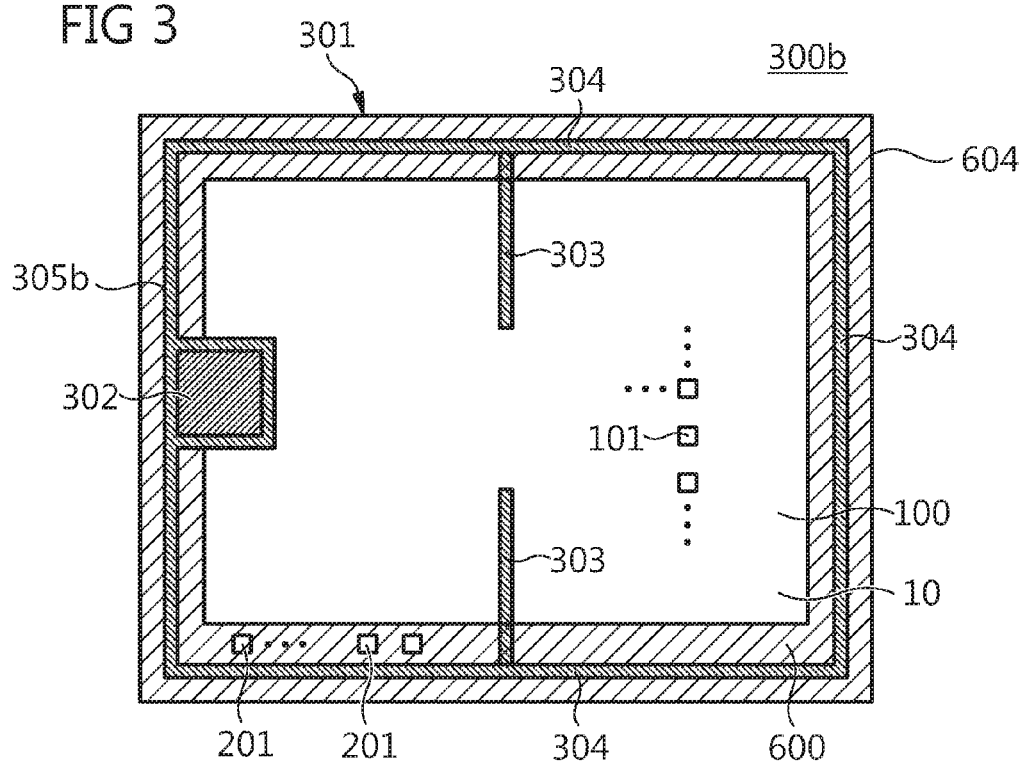
FIG. 3 illustrates a semiconductor switching device provided in a semiconductor substrate, wherein the gate metallization includes gate fingers, according to yet another embodiment.

FIG. 3 illustrates a semiconductor switching device 300b provided on a semiconductor substrate 30 with a modified gate metallization 305b, according to yet another embodiment which can be combined with other embodiments described herein. As shown in FIG. 3, the gate metallization 305b of the semiconductor switching device 300 includes, in addition to the gate metallization 305 shown in FIG. 1, gate fingers 303. The gate metallization 305b includes the gate ring 304, the gate pad 302, and the gate fingers 303. Two gate fingers 303 are shown in FIG. 3. The number of the gate fingers 303 is not restricted to two and can be three, four, five, or even more. The gate fingers 303 transfer the switching signal more efficiently into the main switchable region 100. The gate signal emitter formed by the gate metallization 305b extends closer to main switchable cells 101 as compared to the arrangement shown in FIG. 1.

Figure 4:
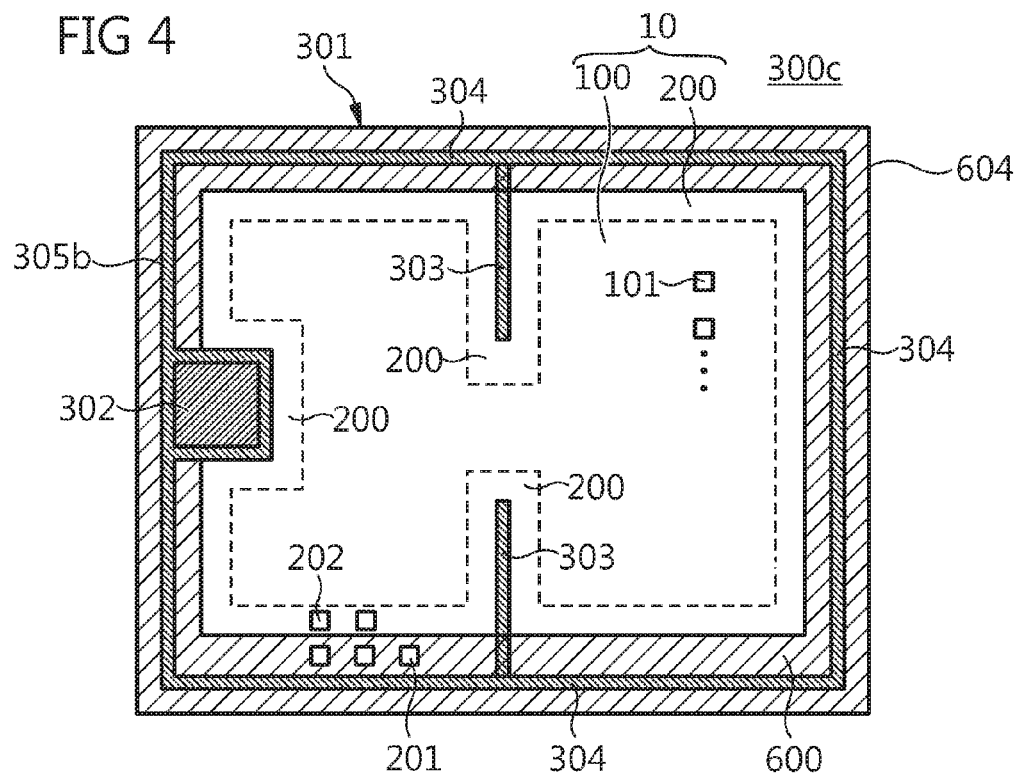
FIG. 4 is a schematic drawing of the semiconductor switching device shown in FIG. 3, wherein a second switchable region is provided close to the gate metallization, according to yet another embodiment.

FIG. 4 is a schematic drawing of the semiconductor switching device 300c having an additional second switchable region 200 which is provided close to the gate metallization 305b. Since the gate metallization 305b includes gate fingers 303 extending deeply into the active area 10, the second switchable region 200 also extends deeply in the active area 10 and surrounds the gate fingers 303. As best illustrated in FIG. 4, the second switchable region 200 is arranged between the first switchable region 100 and the gate metallization 305 also in the regions where the gate fingers 303 are formed since the switchable cells 202 arranged closer to the gate fingers 303, i.e. which have a smaller distance to the gate fingers 303, would also "see" the gate voltage earlier than switchable cells 101 arranged in a greater distance to the gate fingers 303.

According to embodiments which can be combined with other embodiments described herein, a ratio of the area of the second switchable region 200 to the area of the first switchable region 100 can be in a range from 10% to 50%, particularly in a range from 20% to 40%, and specifically can amount to approximately 30%.

As described above, physical properties of the second switchable cells 202 are adapted to be different from physical properties of the first switchable cells 101 to adapt the switching behavior for partially compensating of the inhomogeneous gate signal distribution in the active area 10. The adapted physical property can be, for example, the gate-drain capacitance Cgd of the respective switchable cells 101, 202.

As explained further below, the number switchable regions with different gate-drain capacitance Cgd can be larger than two. This allows for a better local "approximation" of the specific gate-drain capacitance to improve the gate voltage signal distribution, so that the number of cells which become conductive at the same time or within a very short duration increases.

According to an embodiment, the number of switchable regions 100, 200 can be increased to adapt it to the expected critical profile, which depends on the signal distribution properties of the technology such as layout geometry and gate material resistance.

Figure 12:
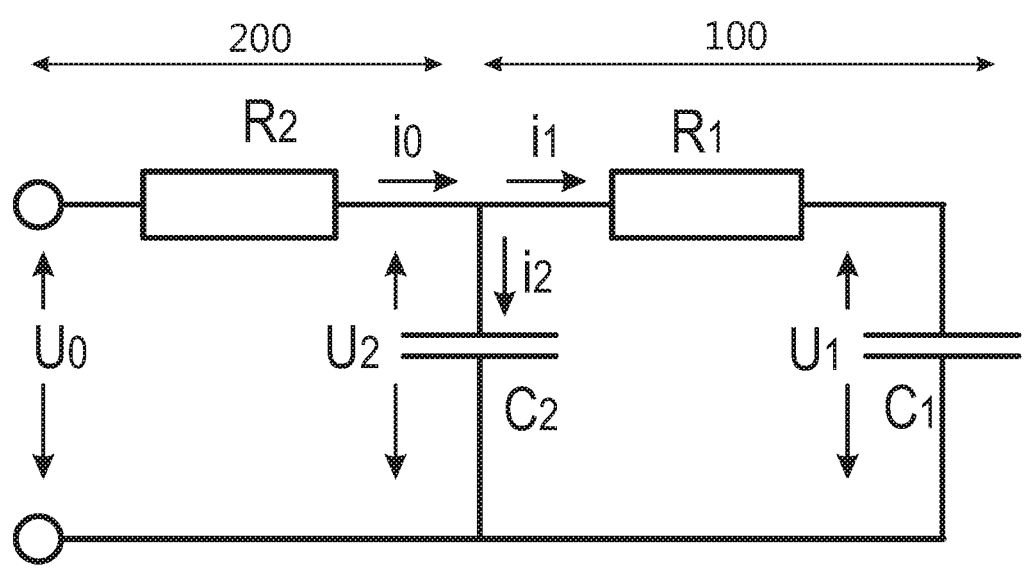
FIG. 12 illustrates the effect of the locally adapted gate-drain capacitance, according to an embodiment.

The effect of a locally varying gate-drain capacitance is schematically illustrated in FIG. 12. For ease of explanation, only two switchable cells representative for the first and second switchable region 100, 200 are illustrated. The second switchable cell has the gate-drain capacitance C2 and the first switchable cell has a gate-drain capacitance C1. U0 represent the voltage applied to the gate metallization. Assume that C2 is equal to C1, and R1 is equal to R2. Then C2 is charged faster than C1 The voltage U1 across C1 is smaller than U2 as it holds: U1=U2−i1*R1.

When C1 would be much larger than C2, the charging of C1 is retarded and the voltage U1 across C1 would be low for a longer time. This means that the gate voltage for the second switchable cell in the second switchable region 200 is low and thus this switchable cell is not rendered conductive.

When C2 would be much larger than C1, the charging of C2 is retarded. However, the charging of C1 would also be slower as U1 cannot be larger than U2. On the other hand, the voltage U1 across C1 having a much lower capacitance than C2 would be more closer to U2 in comparison to the case where C1 would be much larger than C2.

Hence, by making C2 larger than C1, the voltages U1 and U2 have a more similar voltage rise than in the case when C1 is equal C2.

It is noted that the effective gate resistance for the first switchable cell is R1+R2, while the effective gate resistance for the second switchable cell is R2. Typically, R1 is equal to R2. In embodiments described herein. R2 can be lower than R1. For example, by locally varying the cell layout, particularly the layout of the gate electrode structure. R2 and R1 can be adapted. The variation of the cell layout can also be used to adapt the gate-drain capacitance. Additionally, for optionally varying the threshold voltage, typically the doping concentration of the body regions of the cells is locally adapted.

According to an embodiment, the total gate-drain capacitance of the device remains unchanged to keep the electrical properties of the whole device constant. Based on the total gate-drain capacitance of the device and the number of cells, one can define a mean gate-drain capacitance Cgd0 per cell. The gate drain capacitance Cgd1 of each first switchable cell 101 can thus be reduced in comparison to the mean gate-drain capacitance Cgd0 while the gate-drain capacitance Cgd2 of the second switchable cells 202 can be increased in comparison with the mean gate-drain capacitance Cgd0. Since the gate drain capacitance also influences the switching speed of a switchable cell, the first switchable cells 101 are adapted to switch faster than the second switchable cells 202. This at least partially counteracts the retarded distribution of the gate signal into the active area 10.

According to yet another embodiment which can be combined with embodiments described herein, the active area 10 can be subdivided into a number of n sub-regions 200 of switchable cells, wherein a sub-region of switchable cells located closer to the gate metallization 305, 305b is adjacent to and at least partially surrounds another sub-region of switchable cells located further away from the gate metallization 305, 305b. Herein, switchable cells located closer to the gate metallization 305, 305b can have a gate-drain capacitance Cgd larger than a gate-drain capacitance Cgd of switchable cells located further away from the gate metallization 305, 305b.

According to an alternative modification thereof, the number n of sub-regions of switchable cells can be, for example, in a range from n=1 to n=7.

According to an embodiment, the second switchable region 200 can form an outer ring region of the active area 10. Furthermore, multiple switchable regions forming ring structures can also be provided.

Alternatively, the gate metallization can be arranged in a central position of the semiconductor device disposed from the outer rim. In this case, the second switchable region can surround, at least partially, the central gate metallization, and the first switchable region can surround, at least partially, the second switchable region, wherein the second switchable region has a higher specific gate-drain capacitance than the first switchable region.

Detailed structures of switchable cells and a process for manufacturing semiconductor devices are described below with reference to FIG. 5 to FIG. 8.

A method of manufacturing a semiconductor switching device 300 can be illustrated with respect to the cell layout depicted in FIG. 5 to FIG. 8. The method includes providing a semiconductor substrate 300 having an outer rim 604, an active area 10, and an edge termination region 600 arranged between the active area 10 and the outer rim 604. A plurality of switchable cells 101 is formed in the active area 10, wherein each of the switchable cells 101 includes a gate electrode structure and a source region. A source metallization is formed in ohmic contact with the source regions of the switchable cells 101.

Furthermore, a gate metallization 305 is formed in ohmic contact with the gate electrode structures of the switchable cells 101 such that a coverage ratio between the gate electrode structures of the switchable cells 101 and the semiconductor substrate of switchable cells 101 located closer to the gate metallization 305 is larger than the coverage ratio of switchable cells 101 located further away from the gate metallization 305.

Figure 5:
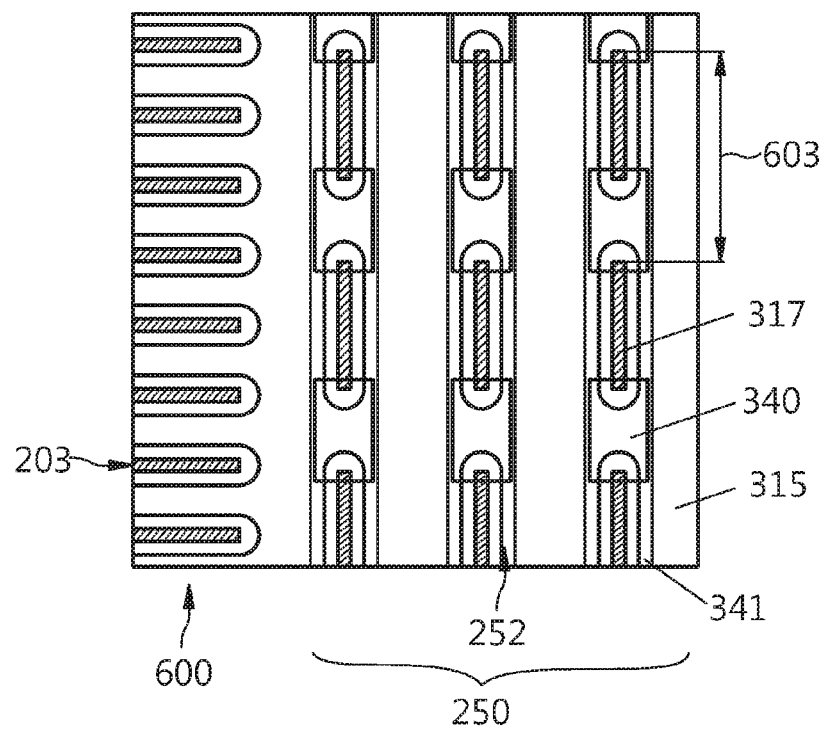
FIG. 5 is a schematic view of a layout of a switchable cell at or near of the edge termination region, according to an embodiment.

FIG. 5 illustrates a cell structure provided in an outer sub-region of the active area 10 which can form, for example, a third switchable region 250. The edge termination region 600 at least partially surrounds the third switchable region 250 of the active area 10. The third switchable region 250 includes third switchable cells 252. The edge termination region 600 includes inactive cells 203. Furthermore, a longitudinal pitch 603 of a cell arrangement of the third switchable cells 252 in third switchable region 250 of the active area is depicted.

Figure 6:
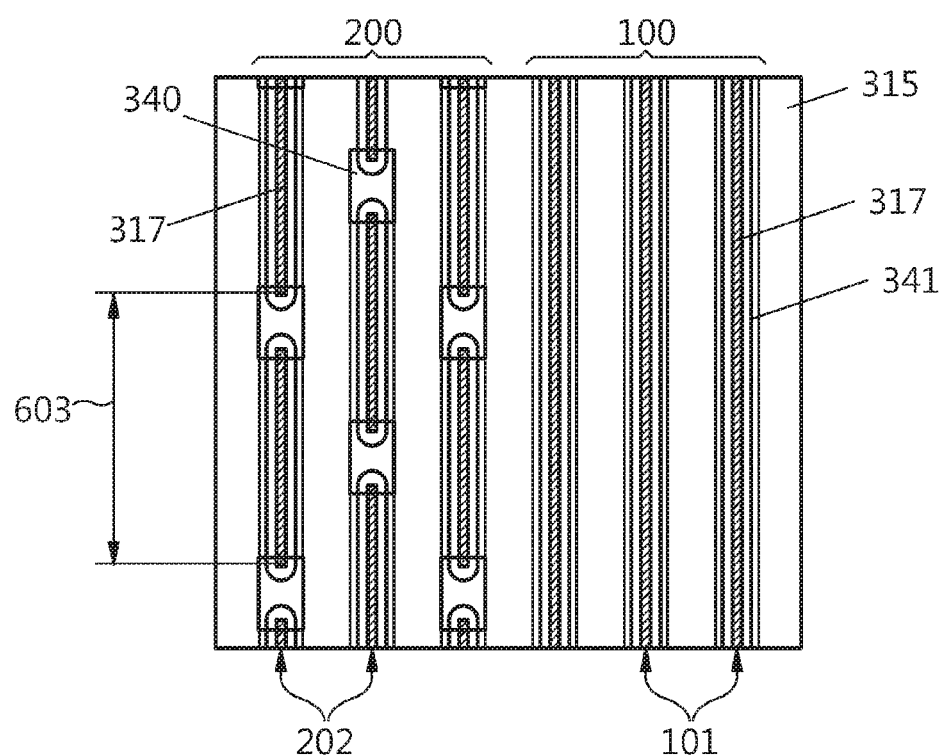
FIG. 6 is a schematic view of a layout of a switchable cell in a transition region between a first switchable region and a second switchable region, according to another embodiment.

FIG. 6 illustrates the cell structure in a transition region from the second switchable region 200 to the first or main switchable region 100 which are provided in the active switchable region 500.

As can be seen in FIGS. 5 and 6, the cell layout of the cell locally varies. For example, the longitudinal pitch 603 of the cells in the third switchable region 250 can be smaller than the longitudinal pitch 603 in the second switchable region 200. The cell layout of the cells in the second and third switchable region 200, 250 can be referred to a bar or strip layout since the source contacts 317 have the shape of bars or strips. Each source contact 317 lands on a single source region. The cells in the second switchable region 200 have longer source contacts 317 and longer source regions than the cells in the third switchable region 250.

The source contacts 317 of the second cell area 200 and the third cell area 250 have a bar layout of different length. Therefore, this cell layout is often called "bar poly." As shown in FIGS. 5 and 6, the length of the source contacts 317 differs between the second to the third switchable region 200, 250. The space between the bars—in their longitudinal extension—is covered by portions of the gate electrode structure 315 which therefore is larger in the third switchable region 250 in comparison with the gate electrode structure 315 of the second switchable region 200, which in turn has a larger gate electrode structure 315 than the first switchable region 100.

The layout of the cells in first switchable region 100 can be described as a strip layout as only one continuous source region is formed per vertical line. Since the source contacts 317 form long strips and are typically formed by polysilicon plugs, this cell layout is also called "strip poly."

The adaptation of the cell layout can also influence the channel width of switchable cell.

The area where the additional portions of the gate electrode 315 are formed is indicated by region 340. In regions 340, adjacent bars of the gate poly are connected to increase the coverage ratio of the gate electrode structure 315 relative to the area of the cells.

According to an embodiment, the longitudinal pitch of the cells is varied to reduce the channel width and the resistance of the gate electrode structure 315 in regions close to the gate metallization 305. Due to the increasing coverage of the gate electrode structure 315 closer to the gate metallization 305, the electrical resistance of the gate electrode structure 315 is also locally reduced which improves distribution of the gate signal. For example, the gate electrode structure 315 of the second switchable region 200 can have a lower specific resistance than the gate electrode structure 315 of the first switchable region 100.

FIG. 7 is another detailed illustration of second switchable cells 202 provided in the second switchable region 200 of the active switchable region 500. As can be seen in FIG. 7, the second switchable cells 202 have a specific longitudinal pitch such that channel width and/or gate poly resistance of cells near chip edge is reduced. Thereby, transistor cells located near the chip edge are provided with a slower switching behavior as compared to transistor cells located in the chip center, i.e. located further away from the chip edge. In other words, a faster or more aggressive switching is provided in the chip center or closer to the chip center.

FIG. 8 is for illustration of a bridges 450 used for varying physical properties of the second switchable cells 202 in the second switchable region 200 of the active switchable region 500, during manufacturing of the semiconductor switching device. The bridges 450 illustrated in FIG. 8 can be arranged in the region of the second switchable cells 202, specifically over areas where a high polysilicon coverage is desired. High polysilicon coverage at specified areas near the chip edge, e.g. in the second switchable region 200, can result in the desired effect, i.e. a faster deep signal penetration into the chip center. The gate-drain capacitance of switchable cells can be adjusted by an appropriate choice of the layout of the gate electrode structure applied during the chip manufacturing process. A large polysilicon coverage provides a high local gate-drain capacitance. Furthermore, increasing the number of bridges 450 and their local density also influences the local polysilicon coverage and thus allows local adaptation of the specific distributed resistance of gate electrode structure.

Furthermore, the size of the bridges 450, 451 also influences the local resistance of the gate electrode structure. As illustrated in FIG. 8, the polysilicon bridges 450 between the second switchable cells 202 in the second switchable region 200 are wider than the polysilicon bridges 451 between the first switchable cells 101 in the first switchable region 100. This results in a decreased specific resistance of the gate electrode structure in the second switchable region 200 in comparison to the specific resistance of the gate electrode structure in the first switchable region 100 which improves faster gate signal penetration into the first switchable region 100.

According to an embodiment, the gate electrode structure in the second switchable region 200 has a specific ohmic resistance which is higher than the specific ohmic resistance of the gate electrode structure in the first switchable region 100.

According to an embodiment the method of manufacturing a semiconductor switching device can include providing a semiconductor substrate including an outer rim, an active area, and an edge termination region arranged between the active area and the outer rim, forming a plurality of switchable cells in the active area, wherein each of the switchable cells includes a gate electrode structure and a source region, depositing a source metallization in ohmic contact with the source regions of the switchable cells, and depositing a gate metallization in ohmic contact with the gate electrode structures of the switchable cells such that a coverage ratio between the gate electrode structures and the semiconductor substrate of switchable cells located closer to the gate metallization is higher than the coverage ratio of switchable cells located further away from the gate metallization.

According to embodiments which can be combined with other embodiments described herein, the gate metallization can include a gate electrode structure such as an electrically conductive structure selected from the group consisting of a gate runner structure, a gate pad, a gate ring, a gate finger, or any combinations thereof. In particular, the plurality of switchable cells can include a transistor selected from the group consisting of a MOSFET, a MISFET, an IGBT, a SJFET (Superjunction FET), and any combinations thereof. A SJFET is a compensation device.

Figure 9A:
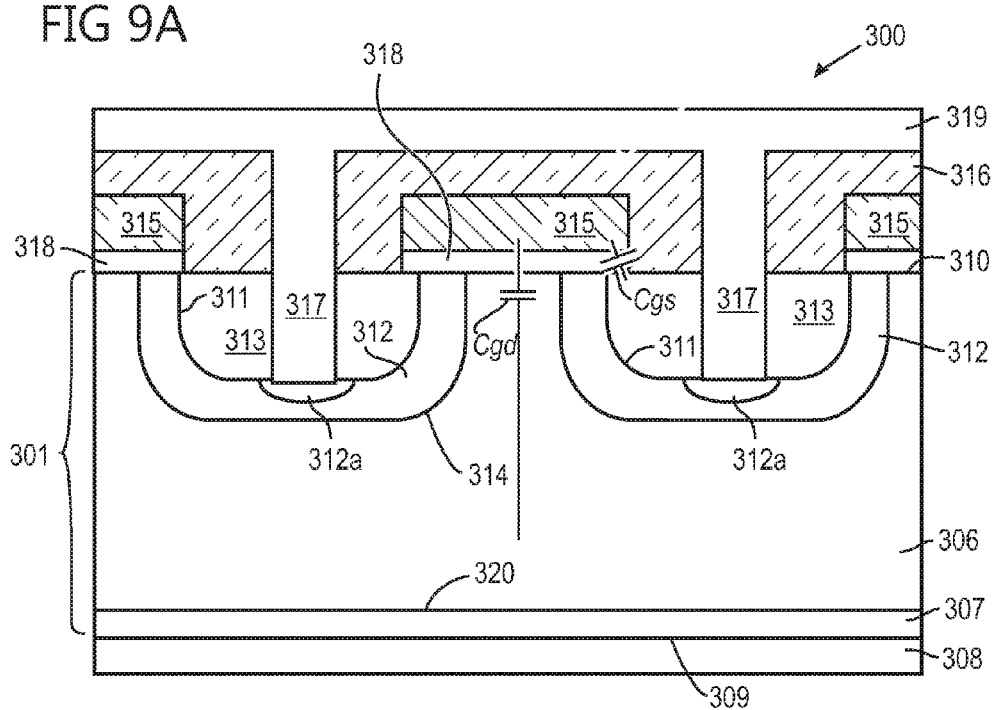
FIG. 9A is a side-sectional view of a portion of an array of switchable cells, according to an embodiment.

FIG. 9A is a cross-sectional view of a portion of a semiconductor device 300, wherein two adjacent switchable cells are illustrated.

The semiconductor substrate 301 has a first, upper side 310 and a second, lower side 309. At the second side 309 a drain region 307 is formed which is electrically connected to a drain metallization 308. A first pn-junction 314 is formed between a drift region 306 and a body region 312. A gate electrode structure 315 includes the gate electrodes and forms a gate-source capacitance Cgs and a gate-drain capacitance Cgd. The body region 312 and a source region 313 are electrically connected by source contacts 317 with a source metallization 319 and are therefore at source potential in this embodiment. An area of the gate-source capacitance Cgs assumes the laterally outer portions of the gate electrode 315, e.g. the area where the gate electrode structure 315 overlaps the source regions 313 and the field-free portions of the body regions 312, in which no space-charge region is formed. The field-free portions of the body regions 312 and the source regions 313 form the counter electrode of the gate-source-capacitance Cgs.

On the other hand, the central portion of the gate electrode structure 315 forms the gate-drain capacitance Cgd. The counter electrode is formed here by the field-free portions of the drift region 306, e.g. the portions of the drift region 306 which are below the space-charge region. The "capacitor dielectric layer" of the gate-drain capacitance Cgd is formed by a dielectric layer 318 and the space-charge region.

To provide a good ohmic contact between the source contacts 317 and the body regions 312, respective body contact regions 312a are formed which have a higher doping concentration than the doping concentration of the body regions 312.

As shown in FIG. 9A, the gate-drain capacitance Cgd can be dependent on the specific coverage ratio between the area of the gate electrode structure 315 and the area of the semiconductor substrate. It is noted here that the active area can include both the area of the first switchable region 100 and the area of the second switchable region (see, e.g. FIGS. 2 and 4). Herein, the specific coverage ratio of the gate electrode structure 315 can be higher in regions of the active area which are located closer to the gate metallization than in regions of the active area which are located further away from the gate metallization.

Figure 9B:
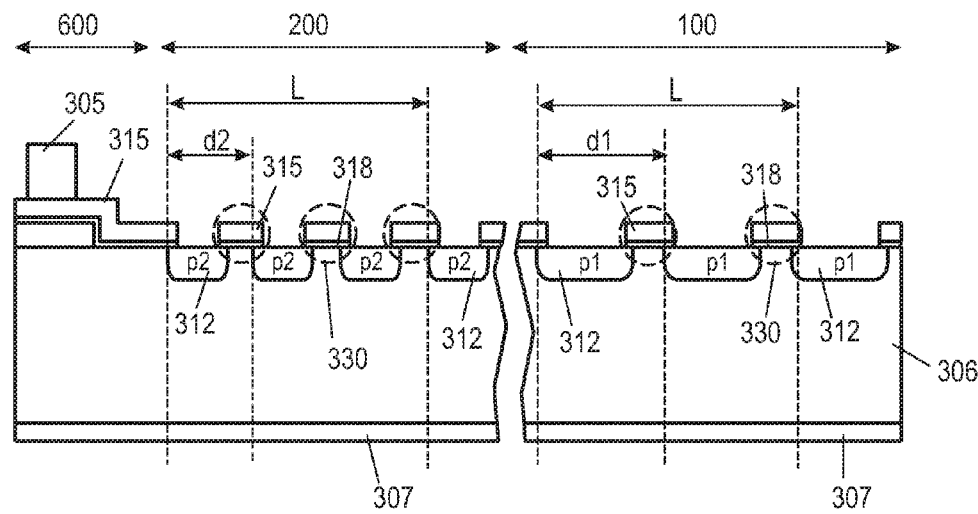
FIG. 9B is a side-sectional view of a portion of an array of switchable cells, according to another embodiment.

This is schematically illustrated in FIG. 9B which shows a cross-section through a semiconductor device according to an embodiment. FIG. 9B shows the active area with the first switchable region 100, which is the central switchable region of the active area, and the second switchable region 200 of the active area formed by the first and second switchable region 100, 200. The second switchable region 200 surrounds the first switchable region 100.

As can be seen in FIG. 9B, the gate electrode structure 315 extends from the first switchable region 100 to the edge termination region 600. The gate metallization 305, specifically a gate ring, is formed in the edge termination region 600 on and in contact with the gate electrode structure 315. Additional gate fingers can also be formed in contact with the gate electrode structure 315 to extend from the gate ring 305 into the second switchable region 200.

The longitudinal pitch of the switchable cells in the first and second switchable region 100, 200 is indicated by the arrows marked with d1 and d2, respectively. Arrow L indicates the length of a "unit region" which is used here to explain the variation of the specific coverage ratio. For sake of ease of explanation, FIG. 9B only illustrates the body regions.

As can be seen in FIG. 9B, the gate electrode structure 315 covers a large/portion in the second cell area 200 than in the first cell area 100. More specifically, the coverage ratio between the gate electrode structure 315 and the drift region 306 is larger in the second switchable region 200 than in the first switchable region 100. This locally increases the gate-drain capacitance Cgd in the second switchable region 200 in comparison to the first switchable region 100.

The regions covered by the gate electrode structures and arranged between adjacent body regions 312 is marked by circles 330. As shown in FIG. 9B, due to the shorter cell pitch d1, the number of covered regions 330 is larger in the second switchable region 200 per unit region L than in the first switchable region 100.

The cell layout is not limited to the geometry illustrated in FIGS. 9A and 9B which show vertical devices with planar gates. The switchable cells can also be trench cells. Alternatively, the switchable cells can also be planar devices having their source regions 313 and drain regions 307 at the first side 310. The local cell layout of the switchable cells can thus be adapted also for trench cells and planar cells to locally increase the gate-drain capacitance and/or the resistance of the gate electrode structure 315 in areas close to the gate signal emitters.

According to embodiments which can be combined with other embodiments described herein, a semiconductor device 300 can include a semiconductor substrate 301 including an outer rim 604, an active area, and an edge termination region 600 arranged between the active area and the outer rim 604, a plurality of switchable cells arranged in the active area, wherein each of the switchable cells includes a gate electrode structure 315 and a source region 313, a source metallization 319 in ohmic contact with the source regions 313 of the switchable cells, and a gate metallization in ohmic contact with the gate electrode structures 315 of the switchable cells, wherein the gate electrode structure 315 of switchable cells which are arranged closer to the gate metallization has a cell layout which is different to a cell layout of the gate electrode structure 315 of switchable cells which are arranged further away from the gate metallization.

Figure 10:
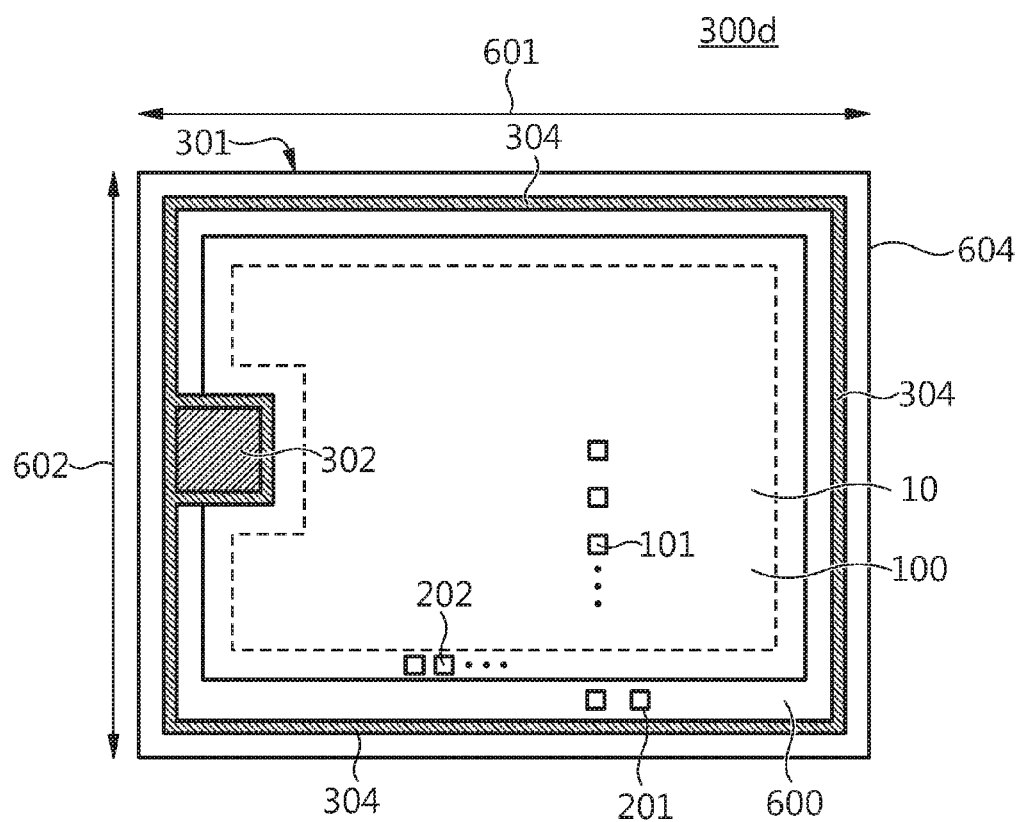
FIG. 10 illustrates a semiconductor switching device having a first switchable region and a second switchable region arranged between the first switchable region and an edge termination region, according to another embodiment.

FIG. 10 illustrates a semiconductor switching device 300d having a first switchable region 100 and a second switchable region 200 arranged between the first switchable region 100 and the edge termination region 600, according to another embodiment which can be combined with other embodiments described herein. Specifically, the active area 10 can include the first switchable region 100 having first switchable cells 101 and the second switchable region 200 having second switchable cells 202, wherein the second switchable region 200 at least partially surrounds the first switchable region 100. The first switchable region 100, or the main switchable region, includes main or first switchable cells 101, whereas is the second switchable region 200 includes sub-region cells 202, or second cells.

As illustrated in FIG. 10, the second switchable region 200 is arranged near or adjacent to the edge termination region 600. As the gate metallization 305 formed, e.g. by the gate ring 304 and the gate pad 302, is arranged within in the edge termination region 600, switchable cells 202 arranged in the second switchable region 200 can receive switching signals in a shorter time period than the first switchable cells 101 located in the main switchable region 100. A physical dimension of the semiconductor substrate can be defined by a substrate length 601 and by a substrate width 602. The substrate length can be in a range from 2 mm to 15 mm, and typically amounts to approximately 10 mm. The substrate width can be in a range from 2 mm to 10 mm, and typically amounts to approximately 7 mm. The second switchable region 100 can have a width along a direction from the edge termination region 600 to the switchable region 100 of up to several hundred μm.

Figure 11:
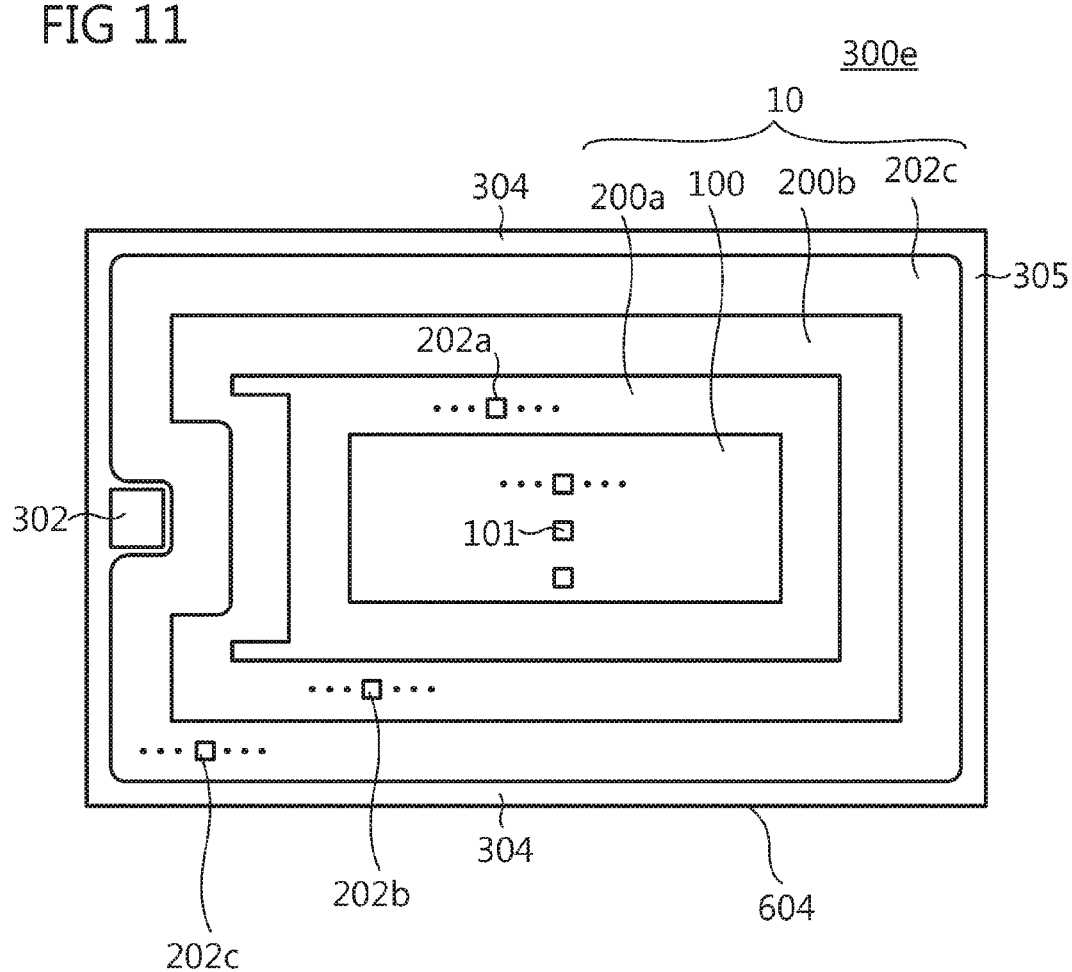
FIG. 11 illustrates a semiconductor switching device having a first switchable region, a second switchable region, a third switchable region, and a fourth switchable region, according to yet another embodiment.

FIG. 11 illustrates a semiconductor switching device 300e having a first switchable region 100 and more than one second switchable region 200a, 200b arranged between the first cell 100 region and an edge termination region 600, according to yet another embodiment which can be combined with embodiments described herein.

In the arrangement shown in FIG. 11, the first (inner or main) switchable region 100 of the active area 10 can include switchable cells 101 having a first specific gate-drain capacitance. According to an embodiment, at least four switchable regions 100, 200a, 200b, 200c can be provided. Herein, the second switchable region 200a of the active area 10 at least partially surrounds the first switchable region 100 and can include switchable cells 202a having a second specific gate-drain capacitance. The third switchable region 200b of the active area 10 at least partially surrounds the second switchable region 200a and can include switchable cells 202b having a third specific gate-drain capacitance. Furthermore, the fourth switchable region 200c of the active area 10 at least partially surrounds the third switchable region 200b and can include switchable cells 202c having a fourth specific gate-drain capacitance. The fourth specific gate-drain capacitance is the highest gate-drain capacitance while the first specific gate-drain capacitance is the lowest gate-drain capacitance, with the second and third specific gate-drain capacitance being between the first and the fourth specific gate-drain capacitance to obtain a step-wise reduction of the specific gate-drain capacitance from the fourth switchable region 202c to the first switchable region 100.

For optionally varying the threshold voltage, an additional implantation step or steps can be performed. For example, the body implantation can be carried out globally, e.g. for the first and the second switchable region 100, 200, while an additional p-implantation is carried out for the second switchable region 200 only. For the additional p-implantation, an extra mask can be used which covers the first switchable region 100.

For varying the specific coverage ratio of the gate electrode structure to adapt locally the gate drain capacitance, the mask for structuring the gate poly is locally adapted to form bridges in the regions 340. In addition to that, the implantation masks for forming the source regions and the body regions can also locally be adapted.

The active area 10 can include a first switchable region 100 of first switchable cells 101, each first switchable cell 101 having a first specific coverage ratio, and a second switchable region 200a of second switchable cells 202a, each second switchable cell 202a having a second specific coverage ratio, and a at least a third switchable region 200b of third switchable cells 202b, each third switchable cell 202b having a third specific coverage ratio, wherein the third specific coverage ratio is larger than the second specific coverage ratio, the second specific coverage ratio is larger than the first specific coverage ratio, and the second switchable region 200a is arranged between the first switchable region 100 and the third switchable region 200c.

In view of the above, a semiconductor device includes, according to an embodiment which can be combined with other embodiments described herein, a semiconductor substrate having an outer rim, an active area, and an edge termination region arranged between the active area and the outer rim. A plurality of switchable cells is arranged in the active area, wherein each of the switchable cells includes a gate electrode structure and a source region. A source metallization is in ohmic contact with the source regions of the switchable cells, and a gate metallization is in ohmic contact with the gate electrode structures of the switchable cells. The active area is subdivided into a number of n sub-regions of switchable cells, wherein a sub-region of switchable cells located closer to the gate metallization is adjacent to and at least partially surrounds another sub-region of switchable cells located further away from the gate metallization, wherein switchable cells located closer to the gate metallization have a gate-drain capacitance larger than a gate-drain capacitance of switchable cells located further away from the gate metallization.

In view of the above, a semiconductor device includes a semiconductor substrate having an outer rim, an active area, and an edge termination region arranged between the active area and the outer rim. A plurality of switchable cells is arranged in the active area, wherein each of the switchable cells has a given area and includes a gate electrode structure, which partially covers the switchable cell, and a source region. A source metallization is in ohmic contact with the source regions of the switchable cells. A gate metallization is in ohmic contact with the gate electrode structures of the switchable cells. A coverage ratio is defined between the gate electrode structure and the area of the switchable cell for each switchable cell, wherein the coverage ratio of switchable cells located closer to the gate metallization is larger than the coverage ratio of switchable cells located further away from the gate metallization.

According to an embodiment, the active area includes a first switchable region of first switchable cells, each first switchable cell having a first coverage ratio, and at least a second switchable region of second switchable cells, each second switchable cell having a second coverage ratio, wherein the second coverage ratio is larger than the first coverage ratio, and wherein the second switchable region is arranged between the first switchable region and the gate metallization.

Spatially relative terms such as "under," "below," "lower," "over," "upper" and the like, are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having." "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The written description above uses specific embodiments to disclose the invention, including the best mode, and also to enable any person skilled in the art to make and use the invention. While the invention has been described in terms of various specific embodiments, those skilled in the art will recognize that the invention can be practiced with modification within the spirit and scope of the claims. Especially, mutually non-exclusive features of the embodiments described above can be combined with each other. The patentable scope is defined by the claims, and can include other examples that occur to those skilled in the ad. Such other examples are intended to be within the scope of the claims if they have structural elements that do not differ from the literal language of the claims, or if they include equivalent structural elements with insubstantial differences from the literal languages of the claims.

It is to be understood that the features of the various example embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for manufacturing a semiconductor device, the method comprising:
   providing a semiconductor substrate comprising an outer rim, an active area, and an edge termination region arranged between the active area and the outer rim;
   forming a plurality of switchable cells in the active area, wherein each of the switchable cells comprises a body region, a gate electrode structure, and a source region, wherein the active area defined by the switchable cells comprises at least a first switchable region having a specific gate-drain capacitance which is different to a specific gate-drain capacitance of a second switchable region;
   forming a source metallization in ohmic contact with the respective source region of the switchable cells; and
   forming a gate metallization in ohmic contact with the respective gate electrode structure of the switchable cells.

2. The method of claim 1, further comprising:
   providing the switchable cells in the first switchable region with a first specific coverage ratio defined by a ratio of the area of the gate electrode structure of said switchable cell to the total area of said switchable cell; and
   providing the switchable cells in the second switchable region with a second specific coverage ratio defined by a ratio of the area of the gate electrode structure of said switchable cell to the total area of said switchable cell, wherein the first specific coverage ratio of switchable cells in the first switchable region is different to the second specific coverage ratio of switchable cells in the second switchable region.

3. The method of claim 1, further comprising:
   disposing the switchable cells in the first switchable region at a first longitudinal pitch; and
   disposing the switchable cells in the second switchable region at a second longitudinal pitch, wherein the first longitudinal pitch of the switchable cells in the first switchable region is different to the second longitudinal pitch of the second switchable cells in the second switchable region.

* * * * *